(12) United States Patent
Suzuki

(10) Patent No.: US 7,262,970 B2
(45) Date of Patent: Aug. 28, 2007

(54) ELECTRONIC DEVICE

(75) Inventor: Takahiro Suzuki, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 307 days.

(21) Appl. No.: 11/006,106

(22) Filed: Dec. 7, 2004

(65) Prior Publication Data
US 2005/0128711 A1 Jun. 16, 2005

(30) Foreign Application Priority Data
Dec. 10, 2003 (JP) .............................. 2003-411240

(51) Int. Cl.
*H05K 7/20* (2006.01)
(52) U.S. Cl. ...................... 361/715; 361/690; 361/719; 361/814
(58) Field of Classification Search ................ 361/715, 361/814
See application file for complete search history.

(56) References Cited
U.S. PATENT DOCUMENTS
2,964,621 A * 12/1960 Foltyn ........................ 455/345
4,872,102 A * 10/1989 Getter ......................... 363/141
5,689,403 A * 11/1997 Robertson et al. .......... 361/695
6,778,388 B1 * 8/2004 Minelli ....................... 361/690

FOREIGN PATENT DOCUMENTS
JP 2001-111272 4/2001

* cited by examiner

*Primary Examiner*—Gregory D Thompson
(74) *Attorney, Agent, or Firm*—RatnerPrestia

(57) ABSTRACT

A first substrate is fixed to a case. A heat-generating component is placed so as to be in contact with a radiator. A second substrate is mounted with the heat-generating component, and the second substrate is connected with the first substrate. The second substrate is put between the case and the radiator so as to be interposed and insulate between them. The first substrate and the second substrate comprise an assembly-guiding structure for assembling the second substrate and the first substrate at a certain assembly position. The assembly-guiding structure is composed of the first substrate defining a projection and the second substrate defining an opening. The amount of heat transfer from the radiator to the case is reduced.

7 Claims, 4 Drawing Sheets

ELECTRONIC DEVICE

BACKGROUND OF THE INVENTION

1. Field of the Invention

The present invention relates to electronic devices which comprise a radiator.

2. Background

For electronic devices, thermal design to prevent a rise of temperature is important. Car audio systems are one of examples in such electronic devices which place importance on thermal design. Some car audio systems comprise a radiator to release heat generated by a power IC or other heat-generating components. A radiator is composed of, for example, an aluminum block, and the block is placed so as to be in contact with a heat-generating component at the rear of a case.

In addition, Japanese Patent Laid-Open Application No. 2001-111272 suggests reducing the amount of heat transfer from a radiator to a case by providing a protrusion from a case of a car audio system and making the radiator be in point-contact with the case at the protrusion.

The above-mentioned conventional car audio system is designed to reduce the heat transfer by making the radiator be in point-contact with the case at the protrusion. However, the radiator is connected with the case at a locating structure which is to assemble the case and the radiator, so heat transfers through the connection to the case.

Up to now, as this example shows, when a radiator such as an aluminum block is provided, the radiator is connected with a case in order to meet requirements for assembly. For this reason, heat transfer from the connection to the case cannot be avoided, and this heat transfer causes a reduction in radiation performance.

Since electronic devices such as car audio systems generate a lot of heat and require to function in severe temperature conditions, further improvement in radiation structure is required.

SUMMARY OF THE INVENTION

The invention was accomplished in light of the above-mentioned background, and its object is to provide an electronic device with improved radiator structure.

The electronic device of the invention comprises: a case; a first substrate fixed to the case; a second substrate connected with the first substrate and mounted with a heat-generating component; and a radiator placed so as to be in contact with the heat-generating component; wherein the second substrate is interposed and insulates between the case and the radiator.

As described hereafter, other aspects of the invention exist. Thus, this summary of the invention is intended to provide a few aspects of the invention and is not intended to limit the scope of the invention described and claimed herein.

BRIEF DESCRIPTION OF THE DRAWINGS

The accompanying drawings are incorporated in and constitute a part of this specification. The drawings exemplify certain aspects of the invention and, together with the description, serve to explain some principles of the invention.

DETAILED DESCRIPTION

Figure 1:
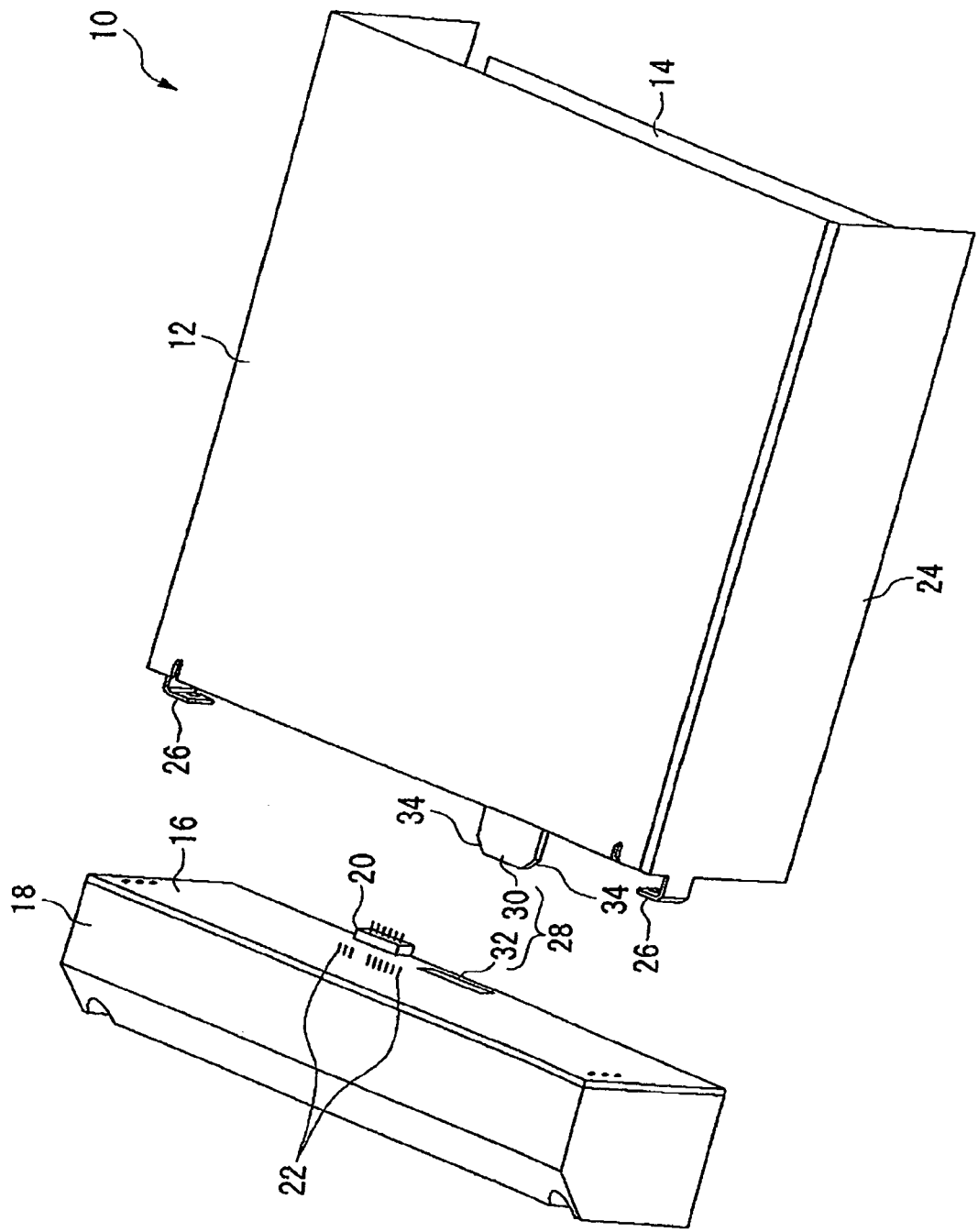
FIG. 1 is an exploded perspective view of a car audio system of an embodiment of the invention.

The following detailed description refers to the accompanying drawings. Although the description includes exemplary implementations, other implementations are possible and changes may be made to the implementations described without departing from the spirit and scope of the invention. The following detailed description and the accompanying drawings do not limit the invention. Instead, the scope of the invention is defined by the appended claims.

The electronic device of the embodiment comprises: a case; a first substrate fixed to the case; a second substrate connected with the first substrate and mounted with a heat-generating component; and a radiator placed so as to be in contact with the heat-generating component; wherein the second substrate is interposed and insulates between the case and the radiator.

In this configuration, the second substrate is put between the case and the radiator and is interposed and insulates between the case and the radiator. Therefore, the amount of heat transfer from the radiator to the case can be reduced, and radiation performance can be improved.

In the electronic device of the embodiment, the second substrate is put between the case and the radiator at a fixing point of the case and the radiator.

In this configuration, the radiator is separated from the case at the fixing point by the substrate. Therefore, the amount of heat transfer from the radiator to the case can be reduced.

In the electronic device of the embodiment, the case comprises a case-side fixing portion protruding from an outer surface of the case and the second substrate is fixed to the case-side fixing portion.

In this configuration, space is left between the second substrate and the case. Therefore, heat transfer to the case can be further reduced.

In the electronic device of the embodiment, the radiator comprises a radiator-side fixing portion protruding from an outer surface of the radiator and the second substrate is fixed to the radiator-side fixing portion.

In this configuration, space is left between the second substrate and the radiator. Therefore, heat transfer to the case can be further reduced.

In the electronic device of the embodiment, each of the first substrate and the second substrate has an assembly-guiding structure for assembling the first substrate and the second substrate at a certain assembly position.

In this configuration, the first substrate and the second substrate are provided with an assembly-guiding structure. Therefore, the amount of heat transfer through the assembly-guiding portion can be reduced, which can further reduce the amount of heat transfer from the radiator to the case.

In the electronic device of the embodiment, the assembly-guiding structure is composed of one of the first substrate and the second substrate defining an opening and the other of the first substrate and the second substrate defining a projection.

In this configuration, the first substrate and the second substrate can be provided with an assembly-guiding structure with simple structure.

An electronic device of another aspect of the embodiment comprises: a case; a substrate mounted with a heat-generating component; and a radiator placed so as to be in contact with the heat-generating component; wherein the substrate is interposed and insulates between the case and the radiator.

In this configuration, too, the substrate is put between the case and the radiator and is interposed and insulates between the case and the radiator. Therefore, the amount of heat transfer from the radiator to the case can be reduced, and radiation performance can be improved.

The electronic device of the embodiment has an assembly-guiding structure for fixing the substrate to a case side at a certain assembly position.

In this configuration, the substrate is provided with an assembly-guiding structure. Therefore, the amount of heat transfer through the assembly-guiding portion can be reduced, which can further reduce the amount of heat transfer from the radiator to the case. In this aspect, the assembly-guiding structure is provided to the substrate to which the radiator is fixed and a member of the case side. The assembly-guiding structure may be provided to the substrate to which the radiator is fixed and a substrate of the case side like the configuration previously described, but the embodiment is not limited to this. For example, the assembly-guiding structure may be provided to the substrate to which the radiator is fixed and a case wall portion of the case side.

As described above, in the device of the embodiment, a substrate is put between a case and a radiator and is interposed and insulates between the case and the radiator. Therefore, the amount of heat transfer from the radiator to the case can be reduced, and radiation performance can be improved.

Now, an electronic device of an embodiment of the invention will be described with reference to the drawings. The electronic device is a car audio system in the embodiment.

FIG. 1 shows the car audio system of the embodiment of the invention. In the FIG. 1, a car audio system 10 comprises a case (chassis) 12, a first substrate 14 fixed to the case 12, a second substrate 16, and a radiator 18 fixed to the second substrate 16.

The case 12 is made of steel sheet. It has a box shape and is formed by bending steel sheet. The first substrate 14 is a plastic printed circuit board. It is the main board of the car audio system 10 and is placed horizontally in the case 12. Though not shown in the figure, various electronic components are mounted on the first substrate 14, and the case 12 also comprises various components other than the first substrate 14.

The second substrate 16 is a plastic printed circuit board as with the first substrate 14, and is provided such that it forms an angle with the first substrate 14. In more detail, the second substrate 16 forms a right angle with the first substrate 14, and therefore stands perpendicularly also to the horizontal plane. The second substrate 16 is almost the same size and shape as the rear of the case 12. The second substrate 16 is provided with a connector 20 for connection with the first substrate 14. Thought not shown in FIG. 1, the first substrate 16 is also provided with a connector at the corresponding location.

The second substrate 16 is mounted with a heat-generating component 22. The heat-generating component 22 is, for example, a power IC and a regulator. In FIG. 1, the body of the heat-generating component 22 is hidden behind the second substrate 16, and pins of the heat-generating component 22 are in view. While the first substrate 14 is a main board, the second substrate 16 can be called an amp board.

The radiator 18 is an aluminum block, and is almost the same size and shape as the second substrate 16. The radiator 18 and the second substrate 16 are fixed to each other. Though not shown in the figure, the heat-generating component 22 is in contact with the radiator 18.

A sidewall 24 of the case 12 is extended in part toward the rear, and the extended part is bent at a right angle. Case-side fixing portions 26 are thus provided to the case 12. The case-side fixing portion 26 is provided with a tapped hole.

The first substrate 14 and the second substrate 16 comprise an assembly-guiding structure 28. The assembly-guiding structure 28 functions as a guide for assembling the second substrate 16 and the first substrate 14 at a certain assembly position. The assembly-guiding structure 28 is composed of the first substrate defining a projection 30 and the second substrate 16 defining an opening 32. The projection 30 and the opening 32 have the same shape. As the projection 30 is inserted into the opening 32, the first substrate 14 and the second substrate 16 are guided and positioned.

In the assembly-guiding structure 28, the projection 30 has an almost quadrangle outline. Both front-end corners 34 are cut off obliquely, which allows smooth assembly of the first substrate 14 and the second substrate 16.

Figure 2:
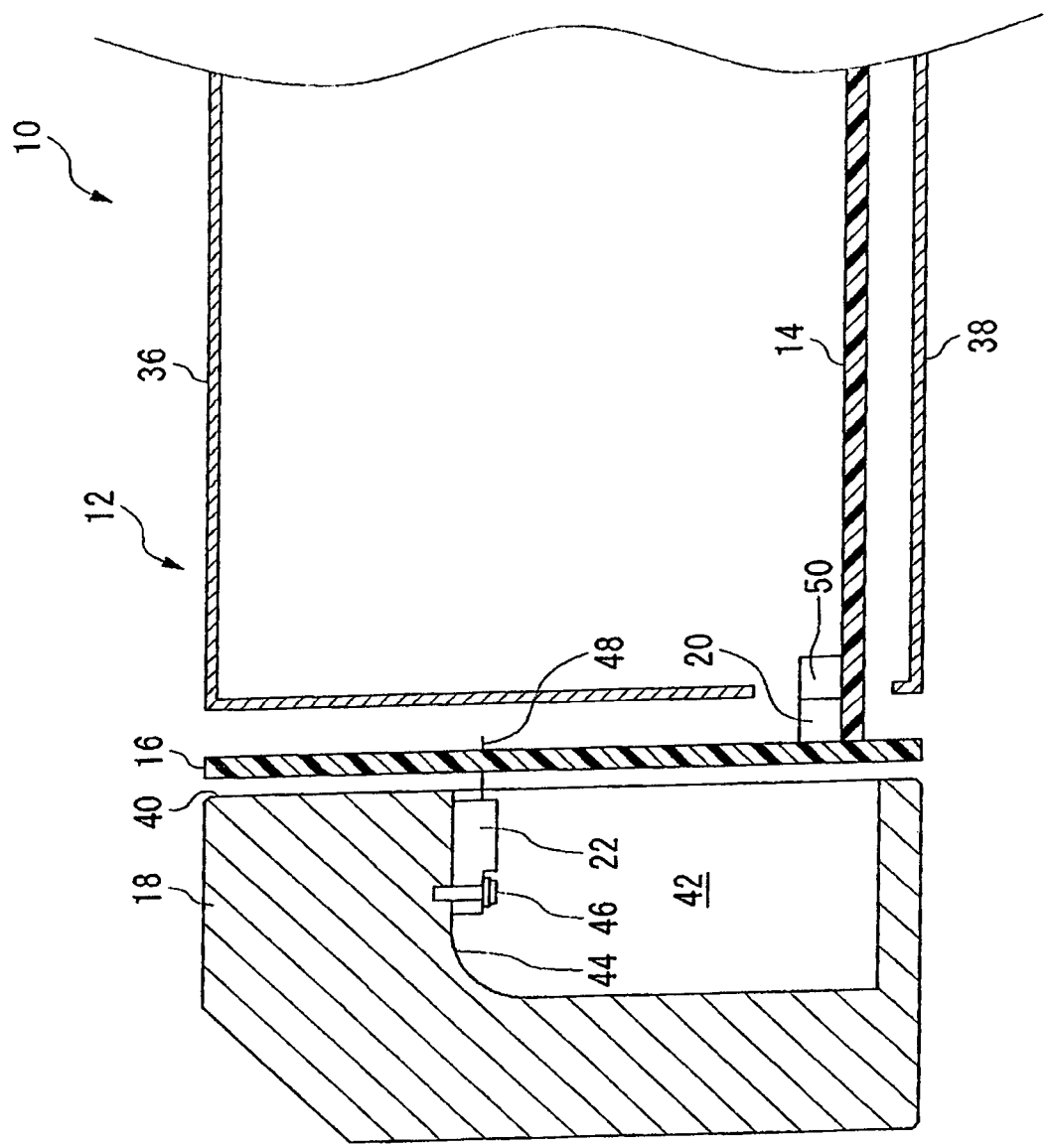
FIG. 2 is a cross section of the car audio system of the embodiment of the invention.

FIG. 2 is a cross section of the car audio system 10 of FIG. 1 and shows the structure of a part where the connector 20 and the heat-generating component 22 are provided.

In FIG. 2, the case 12 is composed of a case body 36 and a bottom cover 38. The case body 36 has a box shape. The first substrate 14 is placed below the case body 36, and is put between the case body 36 and the bottom cover 38.

The radiator 18 has a large hollow 42 at around the lower half of a front face 40. The heat-generating component 22 is in contact with a ceiling 44 of the hollow 42. A screw 46 is tightened to a tapped hole in the ceiling 44 through a fixing hole in the heat-generating component 22, and the heat-generating component 22 is thus fixed to and in contact with the radiator 18. Both of the two heat-generating components 22 shown in FIG. 1 have the contact structure of FIG. 2.

The pins 48 of the heat-generating component 22 are put in through holes in the second substrate 16, and are soldered to the second substrate 16. In this way, the heat-generating component 22 is mounted on the second substrate 16 as previously described.

While the lower part of the second substrate 16 is provided with the connector 20, the first substrate 14 is provided with a case-side connector 50 at a location corresponding to the connector 20. The connector 20 is connected with the connector 50, and the second substrate 16 is thus electrically connected with the first substrate 14.

Figure 3:
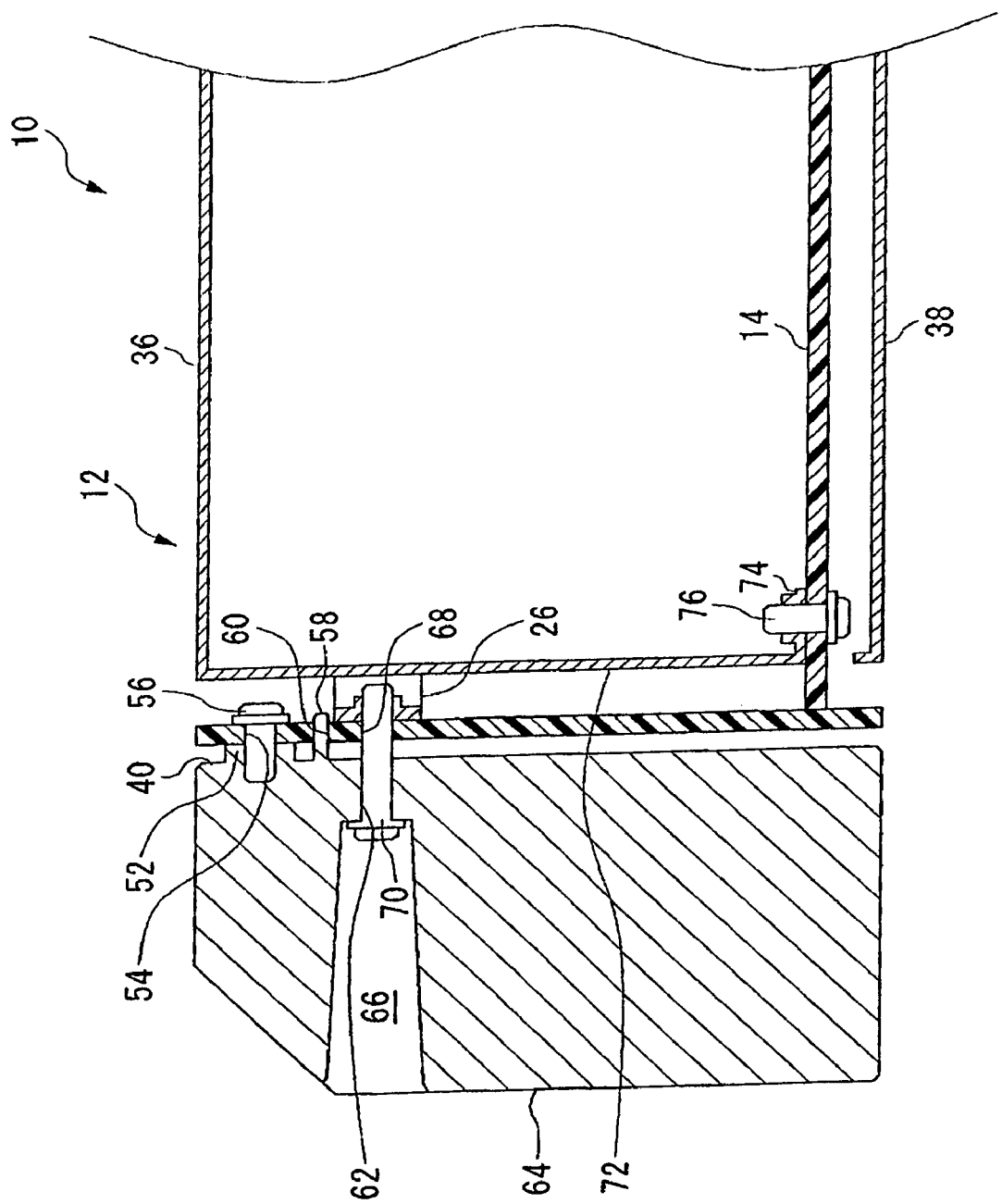
FIG. 3 is a cross section of the car audio system of the embodiment of the invention.

Next, FIG. 3 is a cross section of the car audio system 10 of FIG. 1 at another location and shows the structure of a part where the radiator 18 is fixed to the case 12. The car audio system 10 has the structure of FIG. 3 at around the edge of the both sides.

In FIG. 3, the radiator 18 has a radiator-side fixing portion 52 at the upper part of the front face 40. The radiator-side fixing portion 52 is a boss protruding from the front face 40, and is provided with a tapped hole at the fixing surface. The second substrate 16 has a fixing hole 54 at a location corresponding to the radiator-side fixing portion 52. A screw 56 is tightened to the radiator-side fixing portion 52 through the fixing hole 54, and the second substrate 16 and the radiator 18 are thus fixed to each other. The radiator-side fixing portion 52 protrudes from the front face 40 of the radiator 18, and the fixing surface of the radiator-side fixing portion 52 is provided higher than the front face 40 toward the substrate. In this way, space is formed between the second substrate 16 and the radiator 18.

The radiator 18 also has a locating lug 58 at the lower part of the radiator-side fixing portion 52, and the second substrate 16 has a locating hole 60 at a location corresponding to the locating lug 58. The locating lug 58 is inserted into the locating hole 60, and the second substrate 16 and the radiator 18 are thus aligned with each other.

The radiator 18 also has a fixing hole 62 at a location corresponding to the tapped hole in the case-side fixing portion 26. The radiator 18 is provided with a hollow 66 at its back face 64. The bottom of the hollow 66 reaches near the front face 40, and the fixing hole 62 goes through the radiator 18 at the bottom of the hollow 66.

Moreover, the second substrate 16 also has a fixing hole 68 at a location corresponding to the above-mentioned case-side fixing portion 26 and the fixing hole 62, and a screw 70 is tightened to the case-side fixing portion 26 through the fixing hole 62 and the fixing hole 68. In this way, the case 12 and the radiator 18 are fixed to each other interposing the second substrate 16.

As previously described, the case-side fixing portion 26 of the case 12 is formed by bending the extended part of the rear of the sidewall of the case 12. The case-side fixing portion 26 protrudes from a back face 72 of the case 12, and the fixing surface of the case-side fixing portion 26 is provided higher than the back face 72 toward the substrate. In this way, space is formed between the second substrate 16 and the case 12. Though not shown in the figure, a protrusion or other structure for maintaining space between the second substrate 16 and the radiator 18 is suitably provided around the screw 70.

The case body 36 of the case 12 is bent at the lower end, and is provided with a substrate-fixing portion 74 at the bent part. A screw 76 is tightened to a tapped hole in the substrate-fixing portion 74 through a fixing hole in the first substrate 14, and the first substrate 14 is thus fixed to the case body 36. Though not shown in the figure, the first substrate 14 is fixed to the case body 36 at another location. The bottom cover 38 is fixed to the case body 36 with a screw, too, though not shown in the figure.

Figure 4:
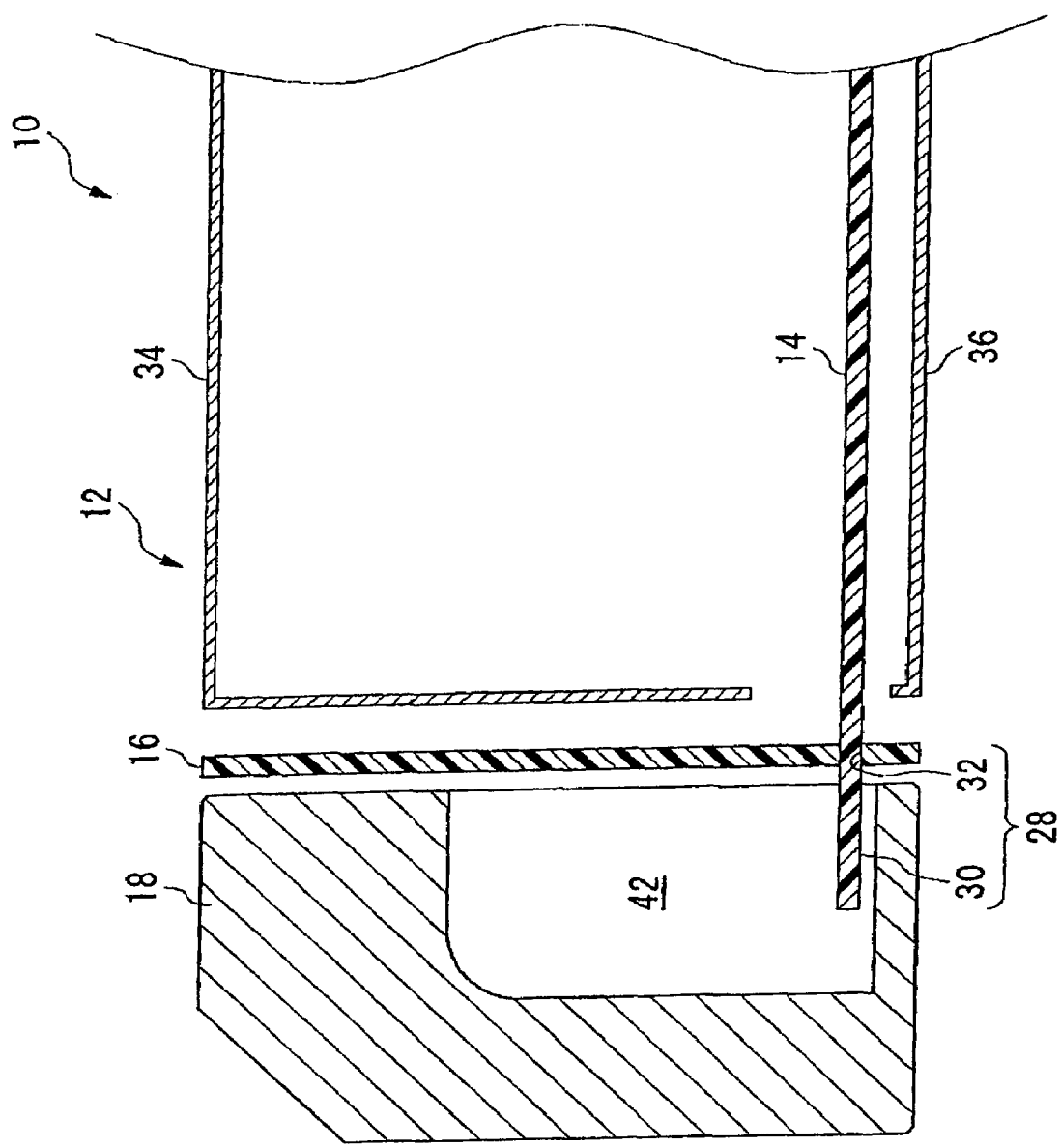
FIG. 4 is a cross section of the car audio system of the embodiment of the invention.

Next, FIG. 4 is a cross section of the car audio system 10 of FIG. 1 at another location and shows the assembly-guiding structure 28.

As shown in FIG. 4, the assembly-guiding structure 28 is composed of the first substrate 14 defining the projection 30 and the second substrate 16 defining the opening 32. The projection 30 is inserted into the opening 32, and it thus sticks out through the second substrate 16 to the rear. The front end of the projection 30 reaches inside the hollow 42 of the radiator 18. The projection 30 and the opening 32 thus position the first substrate 14 and the second substrate 16.

The hollow 42 of the radiator 18 is large enough, in the width direction of the car audio system 10, to accommodate the heat-generating component 22 of FIG. 2 and the projection 30 of the assembly-guiding structure 28 of FIG. 4.

Now, an example of order of assembly of the above-described car audio system 10 will be explained. For a start, the first substrate 14 and other various built-in components are fixed to the case 12. The first substrate 14 is fixed with the screw 76 to the case body 36, and then the bottom cover 38 is fixed to the case body 36. The first substrate 14 is thus placed between the body 36 and the bottom cover 38.

On the other hand, the second substrate 16 and the radiator 18 are assembled. First, the heat-generating component 22 is fixed with the screw 46 to the ceiling 44 of the hollow 42 of the radiator 18. Secondly, the two locating lugs 58 of the radiator 18 are inserted into the two locating holes 60 of the second substrate 16, and the second substrate 16 and the radiator 18 are thus positioned. At this time, the pins 48 of the heat-generating component 22 fixed to the radiator 18 go through the fixing holes of the second substrate 16, and are soldered to the second substrate 16. In this way, the heat-generating component 22 is mounted on the second substrate 16.

The screw 56 is then tightened to the radiator-side fixing portion 52 of the radiator 18 through the fixing hole 54 of the second substrate 16, and the second substrate 16 and the radiator 18 are thus assembled. Since the radiator-side fixing portion 52 protrudes from the front face 40 of the radiator 18, space corresponding to the protrusion height is left between the second substrate 16 and the radiator 18.

Next, in a state that the radiator 18 is fixed to the second substrate 16, the second substrate 16 is fixed to the first substrate 14 using the assembly-guiding structure 28. The projection 30 of the first substrate 14 is inserted into the opening 32 of the radiator 18. The corners 34 of the projection 30 are cut off obliquely, which allows smooth insertion of the projection 30 into the opening 32. The projection 30 is inserted into the opening 32 until the edge of the first substrate 14 meets the second substrate 16, and the first substrate 14 and the second substrate 16 are thus positioned to a certain assembly position. At this time, the connector 20 of the second substrate 16 and the connector 50 of the first substrate 14 are connected to each other.

Next, two screws 70 are inserted from the hollow 66 of the back face 64 of the radiator 18, are put in the fixing hole 62 of the radiator 18 and the fixing hole 68 of the second substrate 16, and are tightened to the case-side fixing portion 26 of the case 12. In this way, the case 12 and the radiator 18 are fixed to each other interposing the second substrate 16. At this time, since the case-side fixing portion 26 protrudes from the back face 72 of the case 12, space is left between the second substrate 16 and the case 12.

As described above, the case 12, the first substrate 14, the second substrate 16, and the radiator 18 are fixed to one another.

Now, a heat radiation action of the car audio system 10 of the embodiment will be explained. When the car audio system 10 is used, the heat-generating component 22 generates heat, which is then transferred to the radiator 18. The radiator 18 is connected with the case 12 by way of the second substrate 16, and the radiator 18 is not in direct contact with the case 12. Additionally, the second substrate 16 has high insulation performance as with common substrates. The second substrate 16 is also apart from both the case 12 and the radiator 18. At the assembly-guiding structure 28, the radiator 18 is not in direct contact with the case 12 although the substrates are in contact with each other. For this reason, heat transfer from the radiator 18 to the case 12 is limited to a small amount, and the heat of the heat-generating component 22 is emitted outside only from the radiator 18.

As described above, the amount of heat transfer from the radiator to the case can be reduced and radiation performance can be improved according to the embodiment, since the second substrate is put between the case and the radiator and is interposed and insulates between the case and the radiator.

By the way, as with the example of the plastic board, electrical circuit boards generally have a low heat transfer coefficient and high insulation performance. The embodiment focuses on the characteristic of substrates that insulation performance is high, and uses insulation performance of substrates by placing substrates suitably. The amount of heat transfer to the case is thus reduced with relatively simple structure and few parts.

In the embodiment, the amount of heat transfer from the radiator to the case is reduced, since the second substrate is put between the case and the radiator at the fixing point and the substrate separates the case and the radiator at the fixing point.

As described above, the second substrate is fixed, at the fixing point of the case and the radiator, to the case-side fixing portion protruding from the case, and space is left between the second substrate and the case. The amount of heat transfer to the case can be therefore further reduced.

Moreover, the second substrate is fixed, at the fixing point of the case and the radiator, to the radiator-side fixing portion protruding from the radiator, and space is left between the second substrate and the radiator as well. The amount of heat transfer from the radiator to the case is therefore reduced still further. Besides that, since the radiator-side fixing portion and the case-side fixing portion are not aligned and are provided at different locations from each other, the amount of heat transfer can be further reduced.

In the embodiment, the assembly-guiding structure is provided at the first substrate and the second substrate. The first substrate is fixed to the case, and the radiator is fixed to the second substrate. Therefore, the case and the radiator are also assembled in a certain arrangement by way of the above-mentioned assembly-guiding structure. Since the substrates with high insulation performance are in contact with each other at the assembly-guiding structure, the amount of heat transfer through the assembly-guiding structure can be reduced, and the amount of heat transfer to the case can be reduced. In contrast to a conventional guiding structure in which a radiator is in direct contact with a case, the amount of heat transfer to the case can be greatly reduced.

In the embodiment, the assembly-guiding structure is composed of the first substrate defining the projection and the second substrate defining the opening, and both substrates can thus be provided with a guiding structure with a simple configuration. With the simple structure in which a projection and a hollow are provided to both substrates that are originally to be connected with each other, assembly can be guided by both substrates, and the advantageous effect of reducing the amount of heat transfer can be obtained.

Incidentally, as a variation of the above-mentioned embodiment, the first substrate may be provided with an opening and the second substrate may comprise a projection. An assembly-guiding structure other than an opening and a projection may be provided.

Moreover, one or both of the first substrate and the second substrate need not be made of plastic. For example, glass substrates may be used.

In the above-described embodiment, the case-side fixing portion is formed by bending steel sheet of the case, but the invention is not limited to this. For example, the case-side fixing portion may be a press-formed boss. Similarly, structure of the radiator-side fixing portion need not be limited to the above-described embodiment.

Furthermore, at the case side, the guiding structure may be provided at a member other than the first substrate. For example, a wall of the case is provided with a projection toward the rear, and the projection is inserted into an opening of the second substrate. Also in this configuration, the radiator is not in direct contact with the case at the guiding structure, and the advantageous effect of reducing the amount of heat transfer can be obtained. However, in the previously mentioned assembly-guiding structure using two substrates, the guiding structure is provided to both substrates that are originally to be connected with each other, and therefore an assembly-guiding structure can be realized with a simple configuration.

Still further, the electronic device related to the invention has the advantageous effect of improving radiation performance, and is useful as car audio systems and the like.

Persons of ordinary skill in the art will realize that many modifications and variations of the above embodiments may be made without departing from the novel and advantageous features of the present invention. Accordingly, all such modifications and variations are intended to be included within the scope of the appended claims. The specification and examples are only exemplary. The following claims define the true scope and spirit of the invention.

What is claimed is:

1. An electronic device comprising:
a case;
a first substrate fixed to said case;
a second substrate connected with said first substrate and mounted with a heat-generating component; and
a radiator placed so as to be in contact with said heat-generating component;
wherein said second substrate is put between said case and said radiator at a fixing point of said case and said radiator to insulate between said case and said radiator.

2. The electronic device according to claim 1, wherein said case comprises a case-side fixing portion protruding from an outer surface of said case and said second substrate is fixed to said case-side fixing portion.

3. The electronic device according to claim 1, wherein said radiator comprises a radiator-side fixing portion protruding from an outer surface of said radiator and said second substrate is fixed to said radiator-side fixing portion.

4. The electronic device according to claim 1, wherein each of said first substrate and said second substrate has an assembly-guiding structure for assembling said first substrate and said second substrate at a certain assembly position.

5. The electronic device according to claim 4, wherein said assembly-guiding structure is composed of one of said first substrate and said second substrate defining an opening and the other of said first substrate and said second substrate defining a projection.

6. An electronic device comprising:
a case;
a substrate mounted with a heat-generating component; and
a radiator placed so as to be in contact with said heat-generating component;
wherein said substrate is put between said case and said radiator at a fixing point of said case and said radiator to insulate between said case and said radiator.

7. The electronic device according to claim 6 having an assembly-guiding structure for fixing said substrate to a case side at a certain assembly position.

* * * * *